(12) United States Patent
Pesavento et al.

(10) Patent No.: US 8,451,673 B1
(45) Date of Patent: May 28, 2013

(54) RFID IC WITH TUNNELING-VOLTAGE PROFILE CALIBRATION

(75) Inventors: Alberto Pesavento, Seattle, WA (US); Christopher J. Diorio, Shoreline, WA (US)

(73) Assignee: Impinj, Inc., Seattle, WA (US)

( * ) Notice: Subject to any disclaimer, the term of this patent is extended or adjusted under 35 U.S.C. 154(b) by 143 days.

(21) Appl. No.: 13/033,863

(22) Filed: Feb. 24, 2011

Related U.S. Application Data

(60) Provisional application No. 61/310,146, filed on Mar. 3, 2010.

(51) Int. Cl.
*G11C 7/00* (2006.01)

(52) U.S. Cl.
USPC ........... 365/191; 365/192; 365/226; 365/228; 365/229

(58) Field of Classification Search
USPC .................. 365/191, 192, 228, 226, 229
See application file for complete search history.

(56) References Cited

U.S. PATENT DOCUMENTS

| | | | |
|---|---|---|---|
| 6,515,919 B1 * | 2/2003 | Lee .................................. | 365/192 |
| 7,408,799 B2 * | 8/2008 | Kang ............................. | 365/145 |
| 7,583,180 B2 * | 9/2009 | Sato ........................... | 340/10.51 |
| 7,602,658 B2 * | 10/2009 | Kang et al. ...................... | 365/192 |
| 7,940,073 B1 * | 5/2011 | Stewart ............................... | 326/8 |
| 7,978,484 B2 * | 7/2011 | Grant et al. ................ | 363/21.18 |

* cited by examiner

*Primary Examiner* — Pho M Luu
(74) *Attorney, Agent, or Firm* — Turk IP Law, LLC

(57) ABSTRACT

RFID tag ICs employ tunneling-voltage profile calibration during IC manufacturing to determine and store, typically in nonvolatile memory, a tunneling-voltage profile for writing data to the IC's nonvolatile memory. The IC may subsequently read the profile at power-up, prior to writing the memory, or at other times as determined by the IC or by an interrogating reader. By using the stored profile when writing to the nonvolatile memory the IC may reduce nonvolatile memory write time and oxide stress.

18 Claims, 9 Drawing Sheets

RFID TAG COMPONENTS

RFID SYSTEM

RFID TAG

RFID IC WITH TUNNELING-VOLTAGE PROFILE CALIBRATION

CROSS REFERENCE TO RELATED APPLICATIONS

This application claims the benefit of U.S. Provisional Patent Application Ser. No. 61/310,146 filed on Mar. 3, 2010. The disclosures of the provisional patent application are hereby incorporated by reference for all purposes.

BACKGROUND

Radio Frequency Identification (RFID) systems typically include RFID tags and RFID readers. RFID readers are also known as RFID reader/writers or RFID interrogators. RFID systems can be used in many ways for locating and identifying objects to which the tags are attached. RFID systems are particularly useful in product-related and service-related industries for tracking objects being processed, inventoried, or handled. In such cases, an RFID tag is usually attached to an individual item, or to its package.

In principle, RFID techniques entail using an RFID reader to interrogate one or more RFID tags. The reader transmitting a Radio Frequency (RF) wave performs the interrogation. The RF wave is typically electromagnetic, at least in the far field. The RF wave can also be predominantly electric or magnetic in the near field.

A tag that senses the interrogating RF wave responds by transmitting back another RF wave. The tag generates the transmitted back RF wave either originally, or by reflecting back a portion of the interrogating RF wave in a process known as backscatter. Backscatter may take place in a number of ways.

The reflected-back RF wave may further encode data stored internally in the tag, such as a number. The response is demodulated and decoded by the reader, which thereby identifies, counts, or otherwise interacts with the associated item. The decoded data can denote a serial number, a price, a date, a destination, other attribute(s), any combination of attributes, and so on.

An RFID tag typically includes an antenna and an RFID integrated circuit (IC) including a radio section, a power management section, and frequently a logical section and a memory. In some RFID tags the power management section employs an energy storage device, such as a battery. RFID tags with an energy storage device are known as active or battery-assisted tags. Advances in semiconductor technology have miniaturized the electronics so much that an RFID tag can be powered solely by the RF signal it receives. Such RFID tags do not include an energy storage device such as a battery, and are called passive tags. Regardless of the type, all tags typically store or buffer some energy temporarily in passive storage devices such as capacitors.

At least a portion of the IC memory is typically implemented as nonvolatile memory (NVM). An NVM comprises one or more memory cells, whose contents may be changed by a write operation. If the NVM employs floating-gate memory cells then the write operation often uses electron tunneling, where a high voltage applied across an oxide surrounding a floating gate induces electrons to tunnel onto or off of the floating gate. Because the physical characteristics of the memory cells may vary due to manufacturing tolerances, oxide thicknesses, etc., electron tunneling often employs a succession of voltage pulses of increasing amplitude, each of which is followed by a data-verification step. The pulses are stopped when the memory cell contains the proper value. This iterative write-verify process writes data to the NVM without prior knowledge of the required tunneling voltage and, at the same time, prevents over-tunneling because each new tunneling pulse ramps to only a slightly higher voltage then the prior pulse. Unfortunately, this approach typically wastes a substantial amount of time by slowly ramping the tunneling voltage from a safe, low value to the required value, where this required value may not be appreciably different from the first time that the memory cell was written.

BRIEF SUMMARY

This summary is provided to introduce a selection of concepts in a simplified form that are further described below in the Detailed Description. This summary is not intended to identify key features or essential features of the claimed subject matter, nor is it intended as an aid in determining the scope of the claimed subject matter.

Embodiments are directed to RFID tag ICs and methods of manufacturing RFID tag ICs employing tunneling-voltage profile calibration. The calibration determines and stores, typically in NVM, an optimum tunneling-voltage profile for writing data to the NVM. The IC may subsequently read the profile at power-up, prior to writing the NVM, or at other times as determined by the IC. By using the stored profile when writing data to the NVM the IC can reduce both NVM write time and oxide stress.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The following Detailed Description proceeds with reference to the accompanying drawings, in which.

DETAILED DESCRIPTION

In the following detailed description, references are made to the accompanying drawings that form a part hereof, and in which are shown by way of illustration specific embodiments or examples. These embodiments or examples may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

Figure 1:
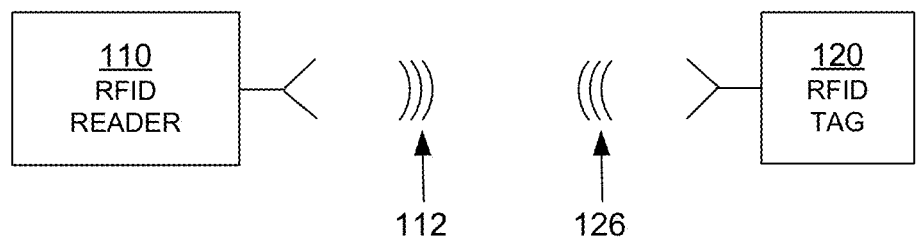
FIG. 1 is a block diagram of components of an RFID system.

FIG. 1 is a diagram of components of a typical RFID system 100, incorporating embodiments. An RFID reader 110 transmits an interrogating Radio Frequency (RF) wave 112. RFID tag 120 in the vicinity of RFID reader 110 may sense interrogating RF wave 112 and generate wave 126 in response. RFID reader 110 senses and interprets wave 126.

Reader 110 and tag 120 exchange data via wave 112 and wave 126. In a session of such an exchange each encodes, modulates, and transmits data to the other, and each receives, demodulates, and decodes data from the other. The data can be modulated onto, and demodulated from, RF waveforms. The RF waveforms are typically in a suitable range of frequencies, such as those near 900 MHz, 2.4 GHz, and so on.

Encoding the data can be performed in a number of ways. For example, protocols are devised to communicate in terms of symbols, also called RFID symbols. A symbol for communicating can be a delimiter, a calibration symbol, and so on. Further symbols can be implemented for ultimately exchanging binary data, such as "0" and "1", if that is desired. In turn, when the symbols are processed internally by reader 110 and tag 120, they can be equivalently considered and treated as numbers having corresponding values, and so on.

Tag 120 can be a passive tag, or an active or battery-assisted tag (i.e., having its own power source). Where tag 120 is a passive tag, it is powered from wave 112.

Figure 2:
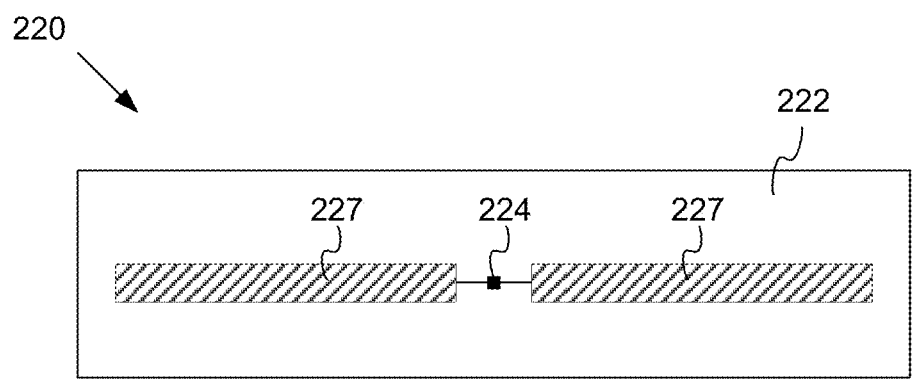
FIG. 2 is a diagram showing components of a passive RFID tag, such as a tag that can be used in the system of FIG. 1.

FIG. 2 is a diagram of an RFID tag 220, which can be the same as tag 120 of FIG. 1. Tag 220 is implemented as a passive tag, meaning it does not have its own power source. Much of what is described in this document, however, applies also to active and battery-assisted tags.

Tag 220 is formed on a substantially planar inlay 222, which can be made in many ways known in the art. Tag 220 includes an electrical circuit which is preferably implemented as an RFID integrated circuit (IC) 224 (also referred to as chip). IC 224 is arranged on inlay 222.

Tag 220 also includes an antenna for exchanging wireless signals with its environment. The antenna is usually flat and formed on inlay 222. IC 224 is electrically coupled to the antenna via suitable antenna connections (not shown in FIG. 2).

The antenna may be made in a number of ways, as discussed in more detail below. In the example of FIG. 2, the antenna is made from two distinct antenna segments 227, which are shown here forming a dipole. Many other embodiments are possible, using any number of antenna segments.

In some embodiments, an antenna can be made with even a single segment. Different points of the segment can be coupled to one or more of the antenna connections of IC 224. For example, the antenna can form a single loop, with its ends coupled to the terminals. It should be remembered that, when the single segment has more complex shapes, even a single segment could behave like multiple segments at the frequencies of RFID wireless communication.

In operation, a signal is received by the antenna and communicated to IC 224. IC 224 both harvests power, and responds if appropriate, based on the incoming signal and the IC's internal state. In order to respond by replying, IC 224 modulates the reflectance of the antenna, which generates backscatter 126 from wave 112 transmitted by the reader. Coupling together and uncoupling the antenna connections of IC 224 can modulate the antenna's reflectance, as can a variety of other means.

In the embodiment of FIG. 2, antenna segments 227 are separate from IC 224. In other embodiments, antenna segments may alternatively be formed on IC 224, and so on. Furthermore, an interface element may be used to couple the IC 224 to the antenna segments 227 (not shown in FIG. 2).

The components of the RFID system of FIG. 1 may communicate with each other in any number of modes. One such mode is called full duplex. Another such mode is called half-duplex, and is described below.

Figure 3:
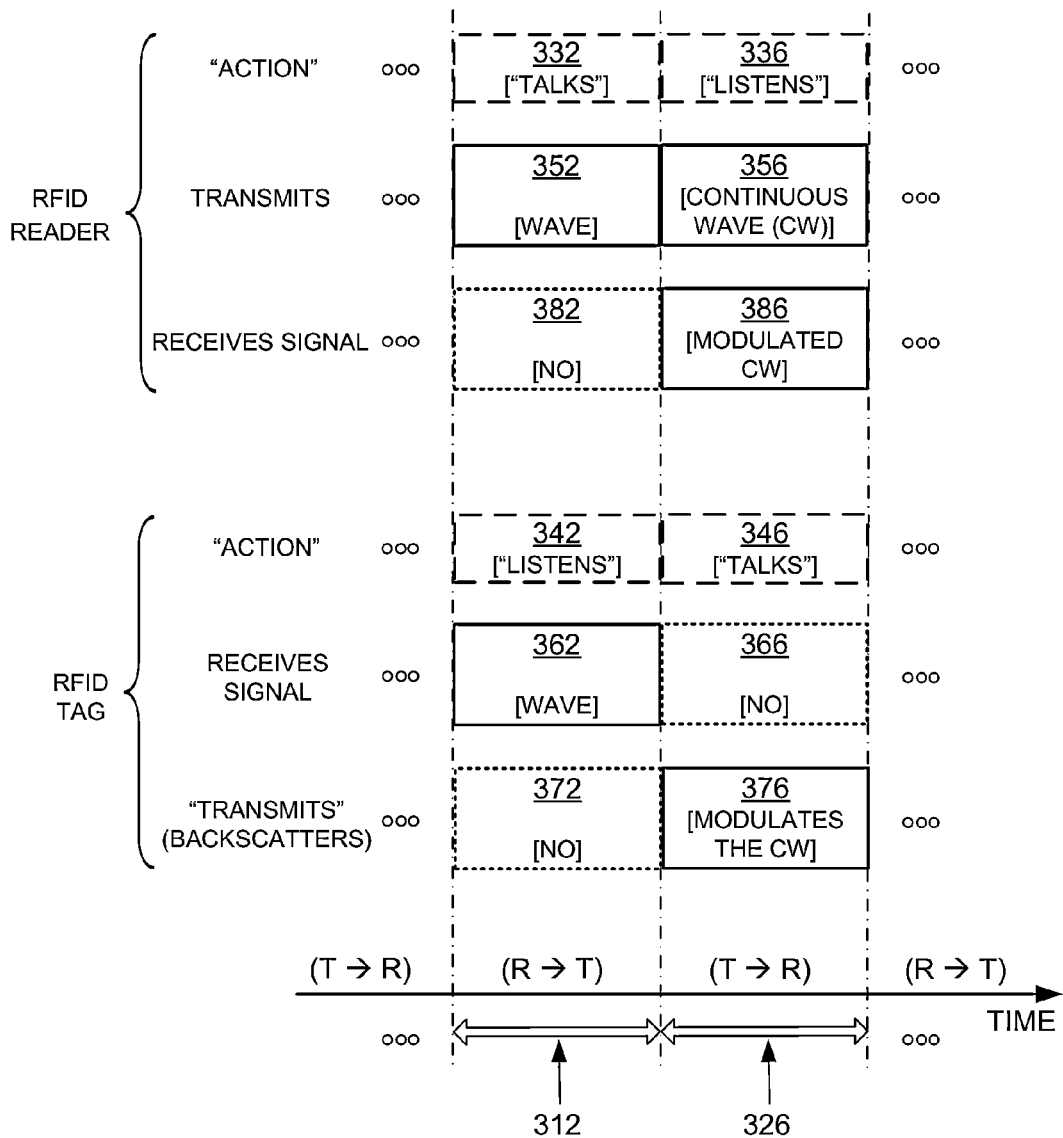
FIG. 3 is a conceptual diagram for explaining a half-duplex mode of communication between the components of the RFID system of FIG. 1.

FIG. 3 is a conceptual diagram 300 for explaining the half-duplex mode of communication between the components of the RFID system of FIG. 1, especially when tag 120 is implemented as passive tag 220 of FIG. 2. The explanation is made with reference to a TIME axis, and also to a human metaphor of "talking" and "listening". The actual technical implementations for "talking" and "listening" are now described.

RFID reader 110 and RFID tag 120 talk and listen to each other by taking turns. As seen on axis TIME, when reader 110 talks to tag 120 the communication session is designated as "R→T", and when tag 120 talks to reader 110 the communication session is designated as "T→R". Along the TIME axis, a sample R→T communication session occurs during a time interval 312, and a following sample T→R communication session occurs during a time interval 326. Of course interval 312 is typically of a different duration than interval 326— here the durations are shown approximately equal only for purposes of illustration.

According to blocks 332 and 336, RFID reader 110 talks during interval 312, and listens during interval 326. According to blocks 342 and 346, RFID tag 120 listens while reader 110 talks (during interval 312), and talks while reader 110 listens (during interval 326).

In terms of actual technical behavior, during interval 312, reader 110 talks to tag 120 as follows. According to block 352, reader 110 transmits wave 112, which was first described in FIG. 1. At the same time, according to block 362, tag 120 receives wave 112 and processes it, to extract data and so on. Meanwhile, according to block 372, tag 120 does not backscatter with its antenna, and according to block 382, reader 110 has no wave to receive from tag 120.

During interval 326, tag 120 talks to reader 110 as follows. According to block 356, reader 110 transmits a Continuous Wave (CW), which can be thought of as a carrier signal that ideally encodes no information. As discussed before, this carrier signal serves both to be harvested by tag 120 for its own internal power needs, and also as a wave that tag 120 can backscatter. Indeed, during interval 326, according to block 366, tag 120 does not receive a signal for processing. Instead, according to block 376, tag 120 modulates the CW emitted according to block 356, so as to generate backscatter wave 126. Concurrently, according to block 386, reader 110 receives backscatter wave 126 and processes it.

Figure 4:
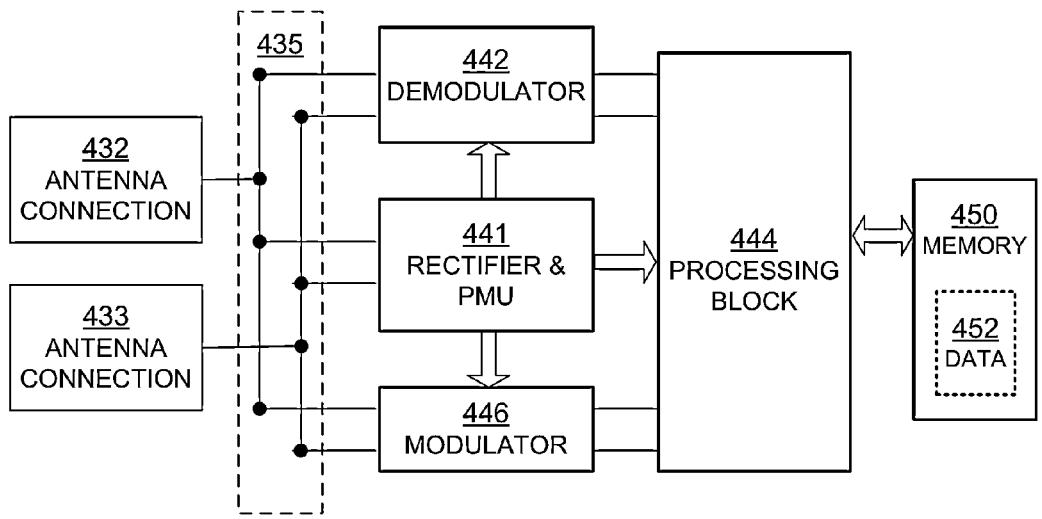
FIG. 4 is a block diagram showing a detail of an RFID tag, such as the one shown in FIG. 1.

FIG. 4 is a block diagram showing a detail of an RFID IC, such as the one shown in FIG. 2. Electrical circuit 424 in FIG. 4 may be formed in an IC of an RFID tag, such as IC 224 of FIG. 2. Circuit 424 has a number of main components that are described in this document. Circuit 424 may have a number of additional components from what is shown and described, or different components, depending on the exact implementation.

Circuit 424 includes at least two antenna connections 432, 433, which are suitable for coupling to one or more antenna segments (not shown in FIG. 4). Antenna connections 432, 433 may be made in any suitable way, such as using pads, bumps, and so on. In a number of embodiments more than two antenna connections are used, especially in embodiments where more antenna segments are used.

Circuit 424 includes a section 435. Section 435 may be implemented as shown, for example as a group of nodes for proper routing of signals. In some embodiments, section 435 may be implemented otherwise, for example to include a receive/transmit switch that can route a signal, and so on.

Circuit 424 also includes a Rectifier and PMU (Power Management Unit) 441. Rectifier and PMU 441 may be implemented in any way known in the art, for harvesting raw RF energy received via antenna connections 432, 433. In some embodiments, block 441 may include more than one rectifier.

In operation, an RF wave received via antenna connections 432, 433 is received by Rectifier and PMU 441, which in turn generates power for the electrical circuits of IC 424. This is true for either or both reader-to-tag (R→T) and tag-to-reader (T→R) sessions, whether or not the received RF wave is modulated.

Circuit 424 additionally includes a demodulator 442. Demodulator 442 demodulates an RF signal received via antenna connections 432, 433. Demodulator 442 may be implemented in any way known in the art, for example including an attenuator stage, an amplifier stage, and so on.

Circuit 424 further includes a processing block 444. Processing block 444 receives the demodulated signal from demodulator 442, and may perform operations. In addition, it may generate an output signal for transmission.

Processing block 444 may be implemented in any way known in the art. For example, processing block 444 may include a number of components, such as a processor, memory, a decoder, an encoder, and so on.

Circuit 424 additionally includes a modulator 446. Modulator 446 modulates an output signal generated by processing block 444. The modulated signal is transmitted by driving antenna connections 432, 433, and therefore driving the load presented by the coupled antenna segment or segments. Modulator 446 may be implemented in any way known in the art, for example including a driver stage, amplifier stage, and so on.

In one embodiment, demodulator 442 and modulator 446 may be combined in a single transceiver circuit. In another embodiment, modulator 446 may include a backscatter transmitter or an active transmitter. In yet other embodiments, demodulator 442 and modulator 446 are part of processing block 444.

Circuit 424 additionally includes a memory 450, which stores data 452. Memory 450 is preferably implemented as a Nonvolatile Memory (NVM), which means that data 452 is retained even when circuit 424 does not have power, as is frequently the case for a passive RFID tag.

In terms of processing a signal, circuit 424 operates differently during a R→T session and a T→R session. The different operations are described below, in this case with circuit 424 representing an IC of an RFID tag.

Figure 5A:
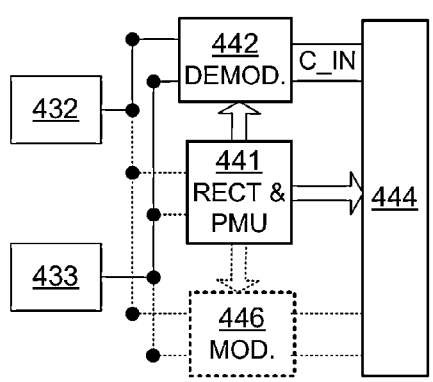
FIGS. 5A and 5B illustrate signal paths during tag-to-reader and reader-to-tag communications in the block diagram of FIG. 4.

FIG. 5A shows version 524-A of components of circuit 424 of FIG. 4, further modified to emphasize a signal operation during a R→T session (receive mode of operation) during time interval 312 of FIG. 3. An RF wave is received by antenna connections 432, 433; a signal is demodulated by demodulator 442; and the demodulated signal is input to processing block 444 as C_IN. In one embodiment, C_IN may include a received stream of symbols.

Version 524-A shows as relatively obscured those components that do not play a part in processing a signal during a R→T session. Indeed, Rectifier and PMU 441 may be active, but only in converting raw RF power. And modulator 446 generally does not transmit during a R→T session. Modulator 446 typically does not interact with the received RF wave significantly, either because switching action in section 435 of FIG. 4 decouples the modulator 446 from the RF wave, or by designing modulator 446 to have a suitable impedance, and so on.

While modulator 446 is typically inactive during a R→T session, it need not be always the case. For example, during a R→T session, modulator 446 could be active in other ways. For example, it could be adjusting its own parameters for operation in a future session.

Figure 5B:
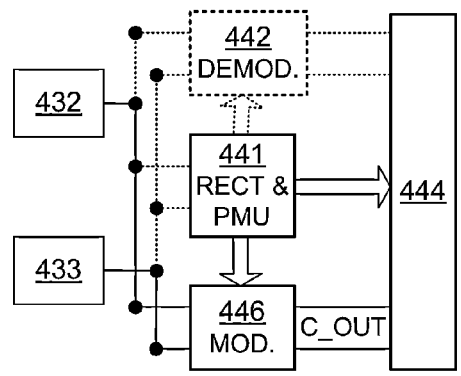

FIG. 5B shows version 524-B of components of circuit 424 of FIG. 4, further modified to emphasize a signal operation during a T→R session during time interval 326 of FIG. 3. A signal is output from processing block 444 as C_OUT. In one embodiment, C_OUT may include a stream of symbols for transmission. C_OUT is then modulated by modulator 446, and output as an RF wave via antenna connections 432, 433.

Version 524-B shows as relatively obscured those components that do not play a part in processing a signal during a T→R session. Indeed, Rectifier and PMU 441 may be active, but only in converting raw RF power. And demodulator 442 generally does not receive during a T→R session. Demodulator 442 typically does not interact with the transmitted RF wave, either because switching action in section 435 decouples the demodulator 442 from the RF wave, or by designing demodulator 442 to have a suitable impedance, and so on.

While demodulator 442 is typically inactive during a T→R session, it need not be always the case. For example, during a T→R session, demodulator 442 could be active in other ways. For example, it could be adjusting its own parameters for operation in a future session.

Figure 6:
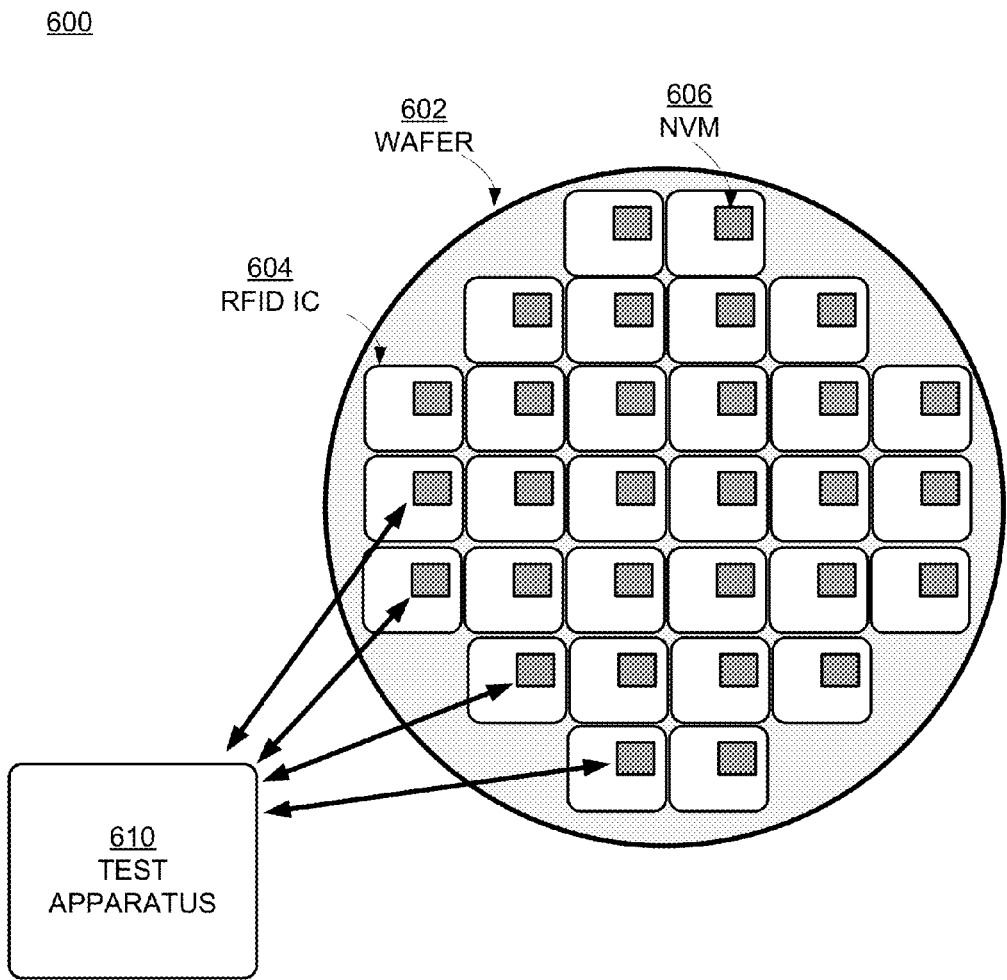
FIG. 6 is a conceptual diagram illustrating a test apparatus calibrating RFID IC NVM while the IC is still part of a semiconductor wafer.

FIG. 6 is a conceptual diagram illustrating a test apparatus calibrating an RFID tag IC NVM while the IC is still on a wafer.

In a typical RFID tag IC manufacturing process, RFID ICs (e.g. RFID IC 604) are manufactured as part of a wafer 602. Each RFID IC 604 includes a memory such as NVM 606. As a consequence of manufacturing variations, each NVM may require a different tunneling voltage to write its memory cells. Test apparatus 610 performs a series of measurements during die- or wafer-level testing to determine the tunneling voltage and then configures (calibrates) each NVM 606 to follow a tailored tunneling-ramp profile. By measuring each IC the wafer-to-wafer or lot-to-lot or even IC-to-IC oxide-thickness variations (as well as other parameters that influence tunneling) may be taken into account in the ramp profile.

The measurements provide information for defining the ramp profile, which may be stored in a digital format (i.e. using bits) or in an analog format (i.e. as voltage or current) in IC memory. Among the stored parameters is the tunneling voltage that an IC charge pump should generate before checking the NVM data as well as a ramp rate for achieving the tunneling voltage. RFID IC 604 may read the stored ramp profile during tag initialization, just before writing the NVM, when told to do so by an RFID reader, or at other times as may be determined by the tag. Then when the IC writes to the NVM it can use the stored ramp profile.

Figure 7:
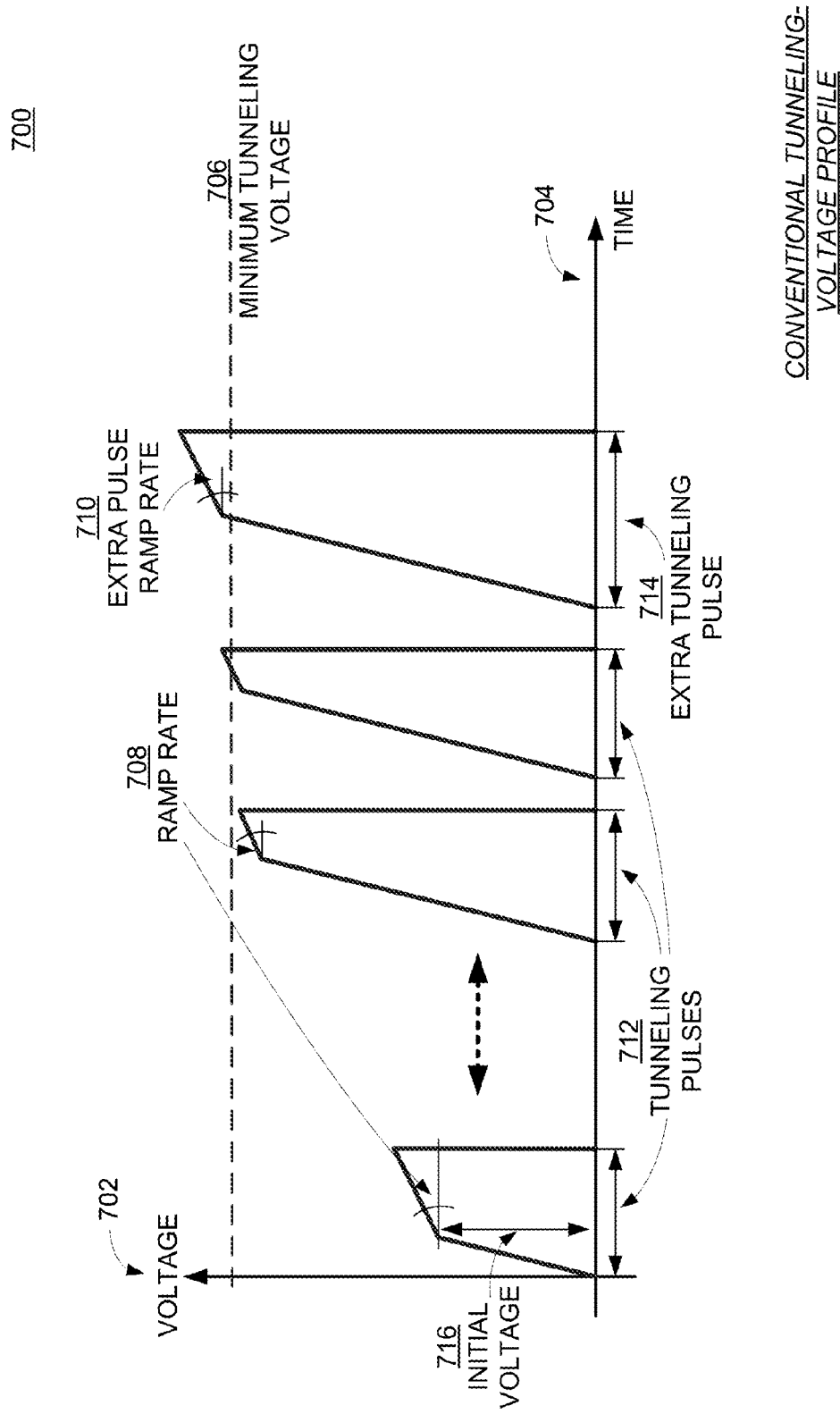
FIG. 7 illustrates a conventional tunneling-voltage profile.

FIG. 7 illustrates a conventional tunneling-voltage profile.

As shown in the voltage (702) vs. time (704) graph 700 of FIG. 7, the conventional tunneling-voltage profiles comprise a series of successive tunneling pulses 712 with interspersed data checks to determine if a memory cell is written adequately. The first tunneling pulse starts at a low voltage 716, and each successive pulse increases the tunneling voltage. Each pulse typically rises quickly to the voltage level of the prior pulse, then gradually ramps the tunneling voltage at the ramp rate 708 during the pulse duration. The voltage at which the data check indicates a successful memory write is denoted the "minimum tunneling voltage". In some implementations, after the data check indicates a successful write, the charge pump issues a last "extra" pulse 714 to ensure a strong write. Note that this process requires multiple pulses and a long time duration to achieve the minimum tunneling voltage, because the charge pump does not have a priori knowledge of the minimum tunneling voltage and starts at a low initial voltage. Clearly, the charge pump can accelerate the process by starting at a high initial voltage, but a high initial voltage may be too high for some memory cells and could damage the oxide. Indeed, the variation in minimum tunneling voltage across NVMs can be so great that a voltage that is inadequate to write one NVM can permanently damage the oxide of another. Consequently, the charge pump must start at the lowest "safe" initial voltage and ramp from there, taking time and causing oxide stress with each pulse.

Figure 8:
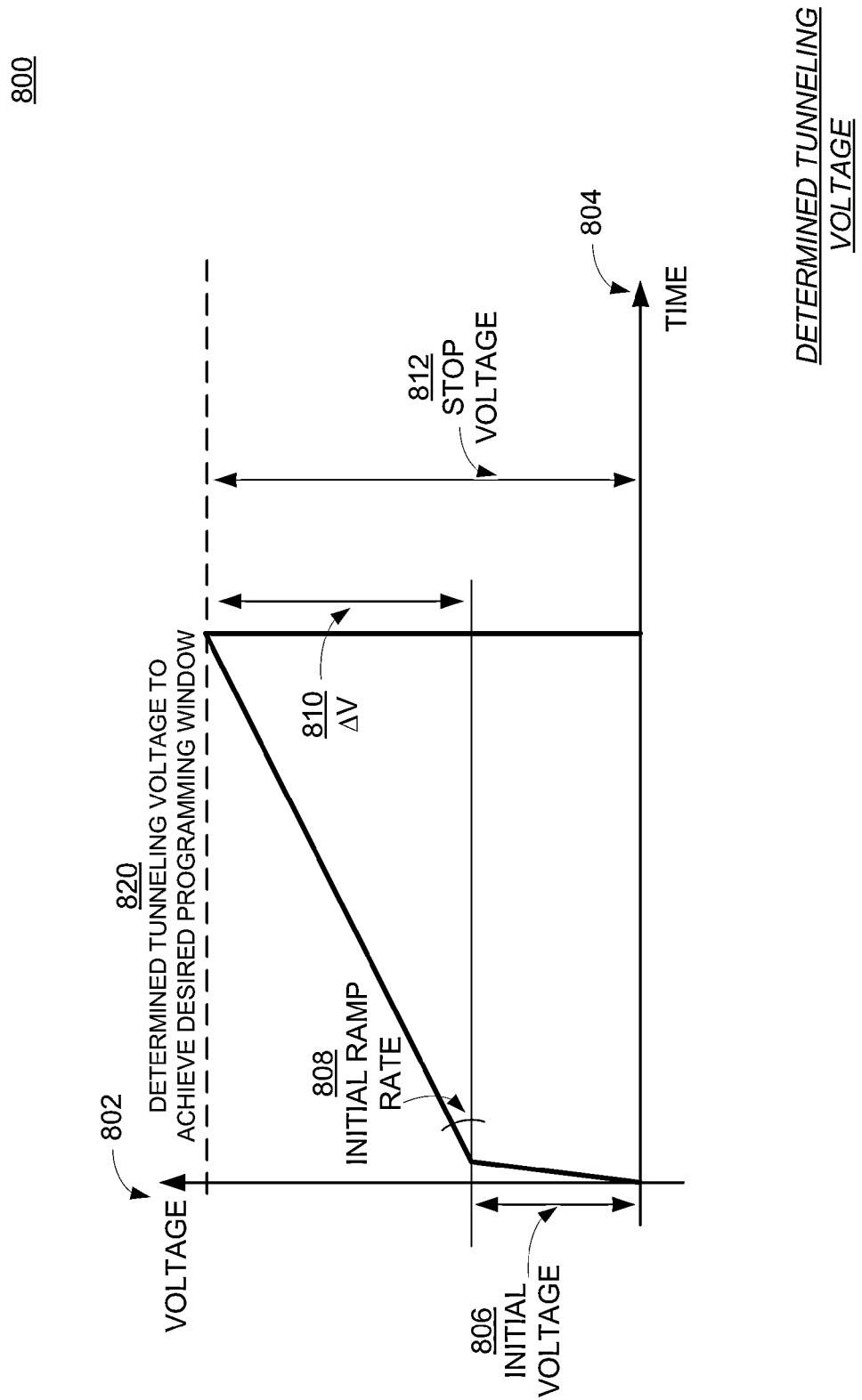
FIG. 8 illustrates a determined tunneling voltage for writing a tag IC NVM.

FIG. 8 illustrates a determined tunneling voltage for programming an NVM.

If a charge pump knows or has access to knowledge about the voltage needed to write data to the NVM, then it may ramp the tunneling voltage rapidly and without pulsing or other interruption to the determined tunneling voltage 820 that achieves the desired programming window, where a programming window is the magnitude of the difference (e.g. voltage) between one state of a memory cell of the NVM and the other state. This rapid ramp is a time-efficient way to program the NVM while at the same time preventing over-tunneling. However, to achieve this profile the charge pump must know or have access to the required tunneling voltage.

Diagram 800 shows an ideal tunneling ramp on a voltage (802) vs. time (804) graph. The tunneling voltage begins with initial voltage 806 and increases at an initial ramp rate 808 until it reaches stop voltage 812, which achieves optimum tunneling and the desired programming window. The voltage difference between initial voltage 806 and stop voltage 812 is $\Delta V$ 810.

In an RFID IC according to embodiments, the initial voltage 806, initial ramp rate 808, and stop voltage 812 may be determined using calibration measurements performed during die- or wafer-level testing. This ramp-profile information may be stored in IC memory, or provided to the tag by a reader at the time of NVM writing. The RFID IC may read the stored information during tag initialization, prior to NVM writing, or at another time as determined by the tag or reader, and may use the stored or provided information when writing to memory. Of course, in some embodiments the memory may still check the value after writing, even when using the determined tunneling voltage, to ensure that the stored value is correct. If necessary the charge pump can issue another pulse to further write the NVM, and may even choose to update the stored profile to change one or more of the initial voltage 806, initial ramp rate 808, or stop voltage 812.

Figure 9:
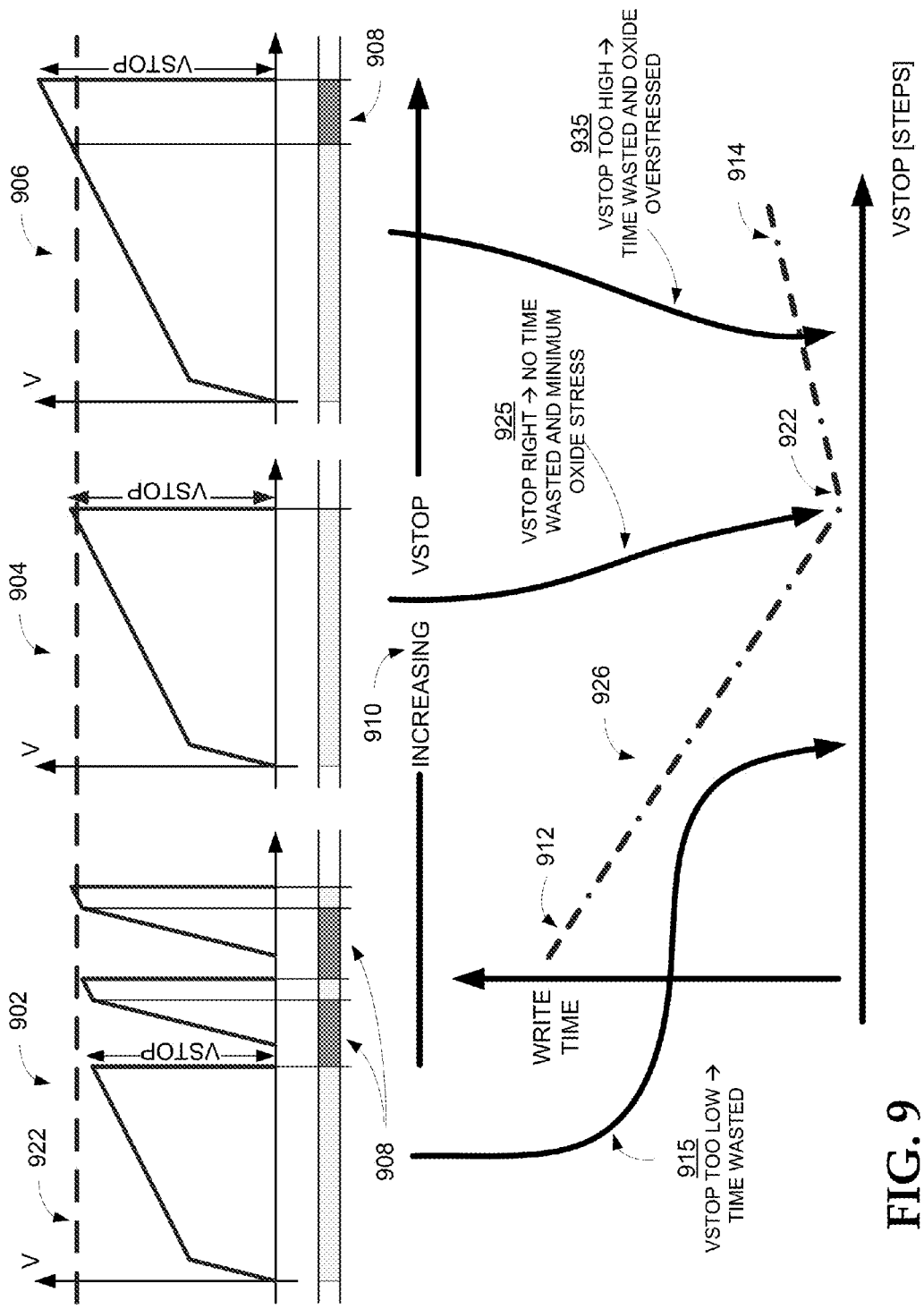
FIG. 9 illustrates how write time and oxide stress may be reduced by employing a tunneling-voltage profile according to embodiments.

FIG. 9 illustrates how write time and oxide stress may be reduced by using tunneling-voltage profile calibration according to embodiments.

The goal of the calibration measurements is to find a tunneling-voltage profile that allows writing data into the NVM within the desired time window but without overstressing the NVM oxide. Diagrams 902, 904, and 906 in FIG. 9 illustrate three different tunneling-ramp scenarios.

Diagram 902 is an example of a stop voltage that is too low, where the initial pulse fails to reach the optimum tunneling voltage. In this case the charge pump must generate additional tunneling pulses with increasing stop voltage (915), wasting time 908. By contrast, diagram 906 is an example of a stop voltage that is too high, wasting time 908 because the tunneling voltage ramps past the optimum, as well as overstressing the oxide due to the high voltage. Diagram 904 illustrates the optimum scenario, where the stop voltage is the optimum tunneling voltage required to write data without wasted time and without overstressing the oxide.

As shown in diagram 926, by choosing the stop voltage to be the optimum tunneling voltage, both the write time and oxide stress are minimized (point 922 on diagram 926). If the stop voltage is less than the optimum tunneling voltage 922 then the write time increases (point 912 on diagram 926). If the stop voltage is greater than the optimum tunneling voltage 922 then the write time increases and the oxide is overstressed (point 914 on diagram 926).

Figure 10:
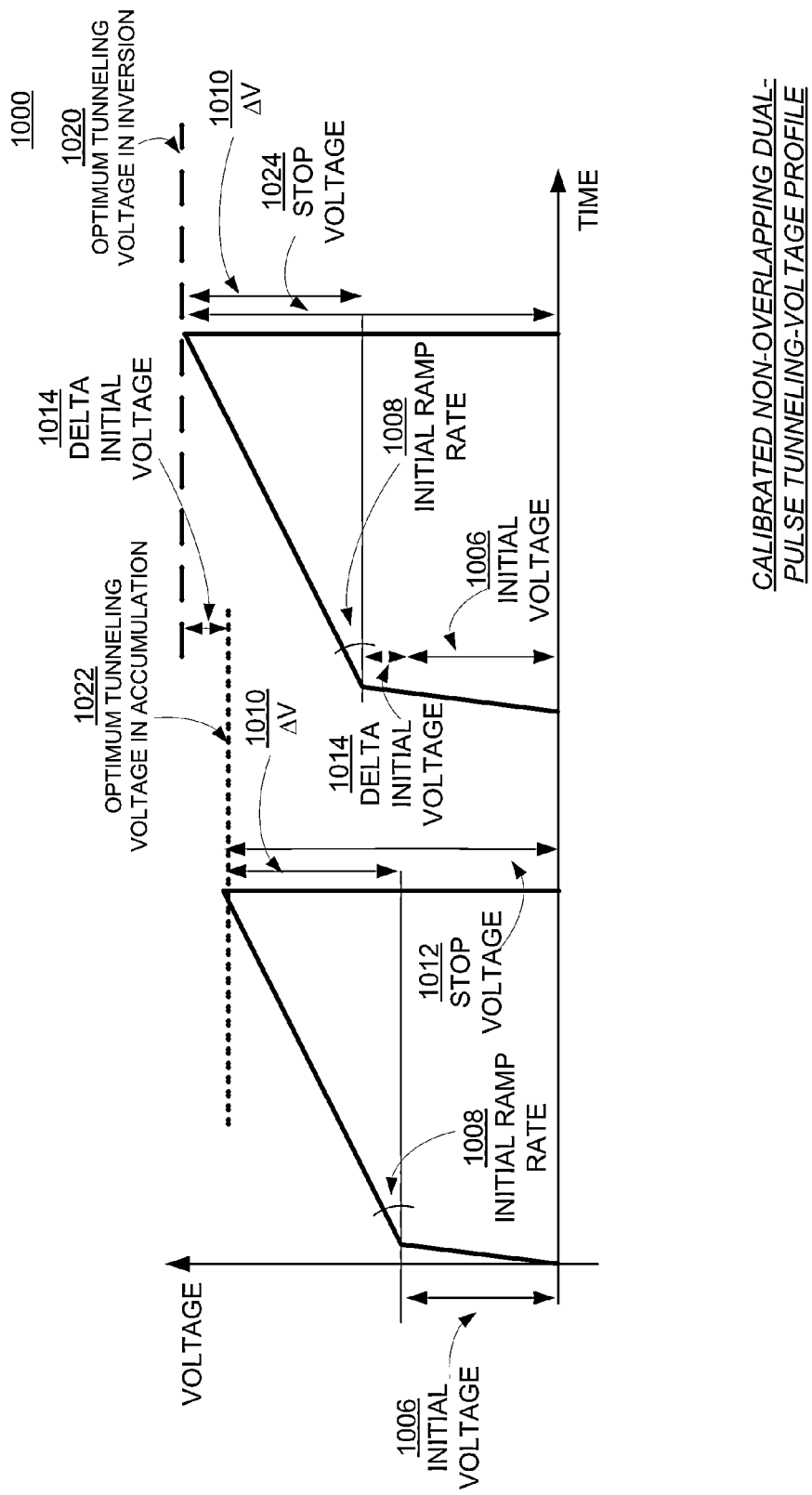
FIG. 10 illustrates an example calibrated, dual-pulse non-overlapping tunneling-voltage profile according to embodiments.

FIG. 10 illustrates an example of a calibrated, non-overlapping dual-pulse tunneling-voltage profile according to embodiments.

Some NVMs tunnel using two pulses, one accumulating and one inverting the doped semiconductor (typically silicon) that tunnels electrons across the floating-gate oxide. One reason to use both accumulation and inversion is to equalize the oxide stress. In most cases the optimum tunneling voltage is different for silicon in inversion and for silicon in accumulation. Regardless, the calibration principle is the same, although in a dual-pulse system the calibration parameters for each of the two pulses are stored in IC NVM rather than the parameters for a single pulse as described previously. Alternatively, it is possible to store parameters for one of the two pulses and then store the difference for the other of the two pulses. Regardless of the storage method, the IC uses the stored parameters to recreate the two pulses during tunneling.

Diagram 1000 illustrates two pulses in an IC employing accumulation and inversion tunneling according to embodiments. As discussed previously, to minimize both the write time and the oxide stress, the pulse for the accumulation phase needs to reach the optimum tunneling voltage in accumulation 1022, and the pulse for the inversion phase needs to reach the optimum tunneling voltage in inversion 1020.

The accumulation pulse starts with an initial voltage 1006 and increases using an initial ramp rate 1008 until reaching stop voltage 1012 with a difference $\Delta V$ 1010 between the initial and stop voltages. The inversion pulse starts with an initial voltage comprising initial voltage 1006 plus delta initial voltage 1014. In this example both pulses use the same ramp rate 1008, although the ramp rates need not be the same. Also in this example, difference $\Delta V$ 1010 is the same, although again, they need not be the same. Because the starting voltage for the inversion pulse was higher by delta initial voltage 1014, the stop voltage 1024 for the inversion pulse is likewise higher by delta initial voltage 1014.

The initial voltages, ramp rates, and stop voltages of both pulses may be stored in IC NVM during tag manufacture for subsequent use. Alternatively, one or more of the initial voltage, ramp rate, and stop voltage maybe stored as delta values as in the example of FIG. 10.

Embodiments also include methods. Some are methods of manufacturing an RFID tag IC. Others are methods for controlling the manufacturing of an RFID tag IC. Others are methods for calibrating an RFID tag IC. These methods can be implemented in any number of ways, including using the structures described in this document. One such way is by machine operations, of devices of the type described in this document. Another way is for one or more of the individual operations to be performed by one or more human operators.

These human operators need not be collocated with each other, but each can be with a machine that performs a portion of a program or operation.

Figure 11:
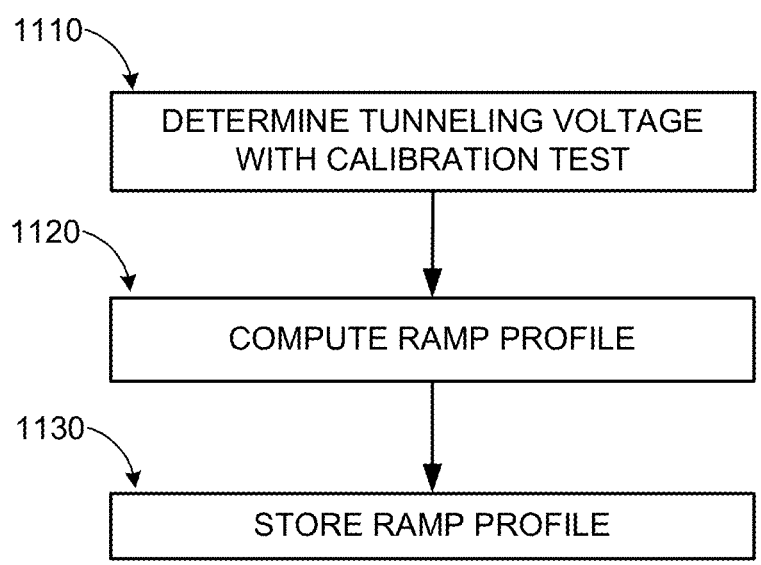
FIG. 11 is a flowchart illustrating a process of an RFID tag IC tunneling-voltage profile calibration according to embodiments.

FIG. 11 is a flowchart illustrating a process of RFID tag IC tunneling-voltage profile calibration according to embodiments.

Process 1100 begins at operation 1110, where a tunneling voltage is determined during calibration. At operation 1120, a ramp profile is computed based on the determined tunneling voltage and at least one of the initial voltage, ramp rate, stop voltage, delta initial voltage, and/or other parameters such as historic process information. At operation 1130, the ramp profile is stored in tag IC NVM such that the IC charge pump can be configured to use the stored parameters during actual tag writing operations. Optionally, an NVM write operation may be performed during the calibration, either before or after storing the ramp profile, to verify the stored ramp profile.

The operations described in process 1100 are for illustration purposes only. Tunneling-voltage profile calibration in an RFID IC may be implemented employing additional or fewer operations and in different orders using the principles described herein. Of course an order of the operations may be modified, some operations eliminated, or other operations added according to other embodiments.

The foregoing detailed description has set forth various embodiments of the devices and/or processes via the use of block diagrams and/or examples. Insofar as such block diagrams and/or examples contain one or more functions and/or aspects, it will be understood by those within the art that each function and/or aspect within such block diagrams or examples may be implemented, according to embodiments formed, individually and/or collectively, by a wide range of hardware, software, firmware, or virtually any combination thereof.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, configurations, memories, and the like, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

We claim:

1. A method for writing a nonvolatile memory (NVM) of a Radio Frequency Identification (RFID) Integrated Circuit (IC) comprising:
    determining a tunneling voltage for the NVM;
    computing a ramp profile for writing the NVM based on at least the determined tunneling voltage; and
    storing the ramp profile in a memory of the IC for at least one from a set of: the entire NVM, a row of the NVM, a set of memory cells in the NVM, and an individual memory cell in the NVM, wherein the IC subsequently writes a value to the NVM by:
        reading the stored ramp profile, and
        using the ramp profile to write the NVM.

2. The method of claim 1, further comprising:
adjusting the ramp profile such that at least one of a time needed to write the NVM and a stress on memory cells of the NVM is minimized.

3. The method of claim 1, further comprising:
computing the ramp profile by adding a predetermined voltage to the determined tunneling voltage, wherein the predetermined voltage is based on at least one from a set of: a programming window, a process characteristic, and a write time requirement.

4. The method of claim 1, further comprising:
computing the ramp profile from at least one of: a determined tunneling voltage of at least one memory cell of the NVM, a determined tunneling voltage of at least one test circuit on a semiconductor wafer, and a determined tunneling voltage of at least one memory cell on the semiconductor wafer.

5. The method of claim 1, further comprising:
reading the stored ramp profile at power-up.

6. The method of claim 1, further comprising:
updating the stored ramp profile after writing the NVM.

7. The method of claim 6, further comprising:
updating the stored ramp profile if the NVM write does not complete in a single tunneling pulse.

8. The method of claim 1, further comprising:
verifying the contents of a memory cell after writing the NVM.

9. The method of claim 1, further comprising:
storing a plurality of ramp profiles for at least one from a set of: an entire NVM, a row of the NVM, and a set of memory cells in the NVM.

10. The method of claim 1, wherein the stored ramp profile contains at least one from a set of: a ramp voltage, a ramp rise time, and a tunneling-pulse duration.

11. An apparatus for calibrating a nonvolatile memory (NVM) of a Radio Frequency Identification (RFID) Integrated Circuit (IC), the apparatus configured to:
determine a tunneling voltage for the NVM;
compute a ramp profile for writing the NVM based on at least the determined tunneling voltage; and
store the ramp profile in a memory of the IC for at least one from a set of: the entire NVM, a row of the NVM, a set of memory cells in the NVM, and an individual memory cell in the NVM such that the IC is enabled to subsequently write a value to the NVM by:
reading the stored ramp profile, and
using the ramp profile to write the NVM.

12. The apparatus of claim 11, wherein the tunneling voltage is determined by adjusting a ramp profile such that one of: a time needed to write the NVM and a stress on memory cells of the NVM is minimized.

13. The apparatus of claim 11, wherein the ramp profile is computed by adding a predetermined voltage to the determined tunneling voltage, wherein the predetermined voltage is based on at least one from a set of: a programming window, a process characteristic, and a write time requirement.

14. The apparatus of claim 11, wherein the ramp profile is computed based on a determined tunneling voltage of at least one from a set of: a memory cell of the NVM, a test circuit on a semiconductor wafer, and a memory cell on the semiconductor wafer.

15. The apparatus of claim 11, wherein the apparatus is further configured to verify the contents of a memory cell after writing to the NVM.

16. The apparatus of claim 15, wherein if the verification fails the apparatus is further configured to:
re-determine the tunneling voltage;
update the stored ramp profile; and
use the updated ramp profile to write the NVM.

17. The apparatus of claim 11, wherein the stored ramp profile contains at least one from a set of: a ramp voltage, a ramp rise time, and a tunneling-pulse duration.

18. A Radio Frequency Identification (RFID) Integrated Circuit (IC) comprising:
a nonvolatile memory (NVM);
a previously determined ramp profile stored in a memory of the RFID IC for at least one from a set of: the entire NVM, a row of the NVM, a set of memory cells in the NVM, and an individual memory cell in the NVM,
wherein prior to writing to a memory cell of the NVM, the RFID IC reads the stored ramp profile and uses the stored ramp profile to write to the memory cell of the NVM in a single tunneling pulse.

* * * * *